(12) United States Patent
Kawamura et al.

(10) Patent No.: US 11,545,829 B2
(45) Date of Patent: Jan. 3, 2023

(54) POWER PREDICTION SYSTEM, POWER PREDICTION DEVICE, POWER PREDICTION METHOD, PROGRAM, AND STORAGE MEDIUM

(71) Applicant: HONDA MOTOR CO., LTD., Tokyo (JP)

(72) Inventors: Masayuki Kawamura, Wako (JP); Hirotaka Endo, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 70 days.

(21) Appl. No.: 17/263,165

(22) PCT Filed: Jul. 31, 2019

(86) PCT No.: PCT/JP2019/030034
§ 371 (c)(1),
(2) Date: Jan. 26, 2021

(87) PCT Pub. No.: WO2020/027202
PCT Pub. Date: Feb. 6, 2020

(65) Prior Publication Data
US 2021/0194244 A1    Jun. 24, 2021

(30) Foreign Application Priority Data

Jul. 31, 2018   (JP) ............................. JP2018-143636

(51) Int. Cl.
*H02J 3/00*     (2006.01)
*G01R 31/367*   (2019.01)
(Continued)

(52) U.S. Cl.
CPC ............ *H02J 3/003* (2020.01); *G01R 21/133* (2013.01); *G01R 31/367* (2019.01); *G06Q 50/06* (2013.01); *H02J 7/0048* (2020.01)

(58) Field of Classification Search
CPC ................................. H02J 13/03; G06Q 50/06
(Continued)

(56) References Cited

U.S. PATENT DOCUMENTS

2004/0207367 A1* 10/2004 Taniguchi .......... G01R 31/3648
320/149
2006/0181245 A1* 8/2006 Mizuno ................ G01R 31/367
320/132
(Continued)

FOREIGN PATENT DOCUMENTS

CN      106021923    10/2016
JP      4164996      10/2008
(Continued)

OTHER PUBLICATIONS

Written Opinion for International Application No. PCT/JP2019/030034 dated Oct. 8, 2019, 5 pages.
(Continued)

*Primary Examiner* — Md Azad
(74) *Attorney, Agent, or Firm* — Amin, Turocy & Watson, LLP

(57) ABSTRACT

A power prediction system includes a battery removably mounted on an electric power device using electric power, a charging device configured to charge the battery, and a power prediction device configured to predict an amount of electric power capable of being supplied by the charging device to outside of the charging device through machine learning on the basis of usage information indicating at least one of the usage state and the usage environment of the charging device.

10 Claims, 7 Drawing Sheets

(51) Int. Cl.
*H02J 7/00* (2006.01)
*G01R 21/133* (2006.01)
*G06Q 50/06* (2012.01)

(58) Field of Classification Search
USPC .......................................................... 700/286
See application file for complete search history.

(56) References Cited

U.S. PATENT DOCUMENTS

| | | | |
|---|---|---|---|
| 2014/0285156 A1* | 9/2014 | Mukaitani ............ | G01R 31/392 320/134 |
| 2017/0177766 A1* | 6/2017 | Song ......................... | H02J 3/00 |
| 2018/0045786 A1 | 2/2018 | Takatsuka et al. | |
| 2019/0033385 A1* | 1/2019 | Karner ............... | G01R 31/3647 |
| 2020/0023747 A1* | 1/2020 | Logvinov ............... | B60L 53/64 |

FOREIGN PATENT DOCUMENTS

| | | |
|---|---|---|
| JP | 2011-172315 | 9/2011 |
| JP | 2014-527689 | 10/2014 |
| JP | 2015-156748 | 8/2015 |
| JP | 2018-033273 | 3/2018 |
| JP | 2018-085825 | 5/2018 |
| JP | 2018-088742 | 6/2018 |
| JP | 2019-068552 | 4/2019 |
| KR | 10-2014-0046295 | 4/2014 |
| WO | 2013/016540 | 1/2013 |
| WO | 2015/075794 | 5/2015 |
| WO | 2016/143384 | 9/2016 |

OTHER PUBLICATIONS

International Search Report and Written Opinion for International Application No. PCT/JP2019/030034 dated Oct. 8, 2019, 6 pages.
Japanese Office Action for Japanese Patent Application No. 2020-506381 dated Jun. 30, 2020.
Japanese Decision of Rejection for Japanese Patent Application No. 2020-506381 dated Dec. 1, 2020.
Extended European Search Report for European Patent Application No. 19844626.2 dated Nov. 8, 2021.

* cited by examiner

1821

| REGION | GRID ID | LEARNING MODEL ID | UPDATE DATE (YEAR/MONTH/DAY) | ... |
|---|---|---|---|---|
| ABC CITY | GR_1 | $MDL_1$ | YY/XX/ZZ | ... |
| DEF TOWN | GR_2 | $MDL_2$ | YY/XX/ZZ | ... |
| GHI CITY | GR_3 | $MDL_3$ | YY/XX/ZZ | ... |
| ... | ... | ... | ... | ... |

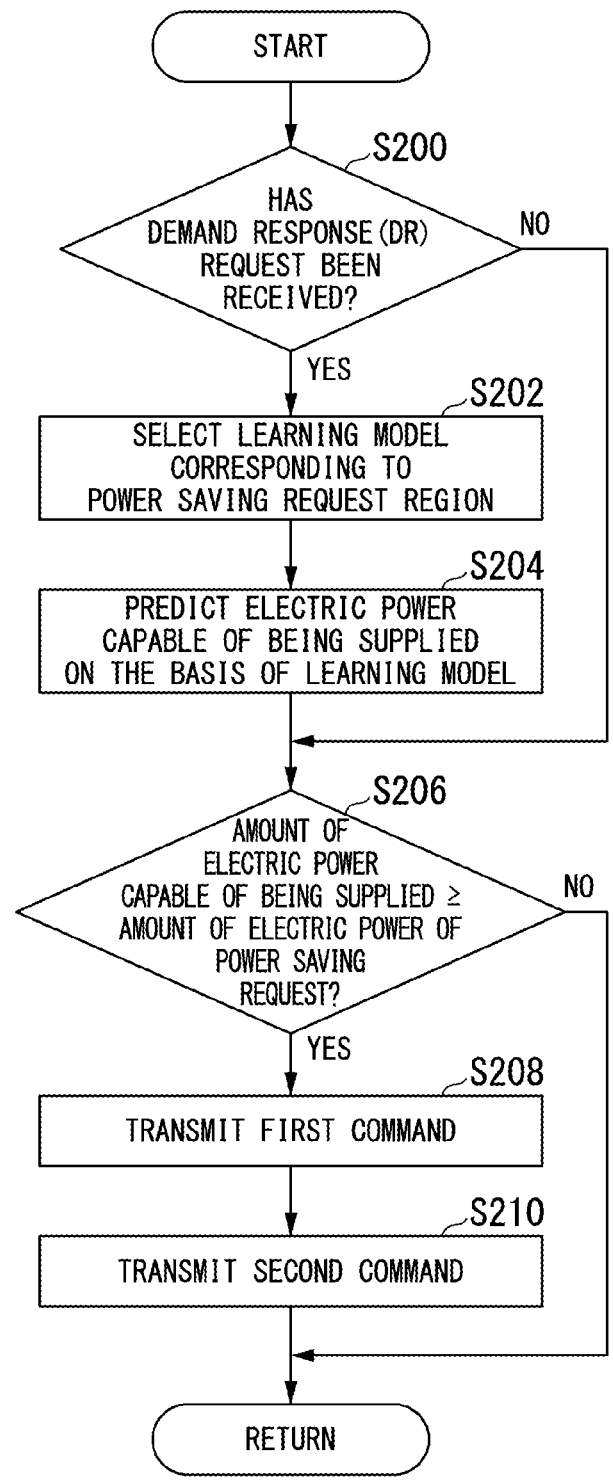

POWER PREDICTION SYSTEM, POWER PREDICTION DEVICE, POWER PREDICTION METHOD, PROGRAM, AND STORAGE MEDIUM

TECHNICAL FIELD

The present invention relates to a power prediction system, a power prediction device, a power prediction method, a program, and a storage medium.

Priority is claimed on Japanese Patent Application No. 2018-143636, filed Jul. 31, 2018, the content of which is incorporated herein by reference.

BACKGROUND ART

A demand response in which electric power companies request customers to limit power consumption for a time period of power supply/demand tightness is known. In relation to this, technology for predicting an amount of electric power of a limited power consumption request as a demand response from an electric power company on the next day from forecasts such as temperature and weather on the next day is known (see, for example, Patent Document 1). On the other hand, technology for promoting the shared use of batteries including processes of extracting a battery mounted on a movable object such as an electric scooter and mounting the extracted battery on a charging device such as a charging station to cause the extracted battery to be charged and extracting another battery which has already been charged from the charging device and mounting the extracted battery on the movable object is known (see, for example, Patent Document 2). Also, as another example of a movable object in which a battery can be removably mounted, a portable power charging/supplying device including a battery and a power charging/supplying unit in which a storage chamber for storing the battery is formed is described (see, for example, Patent Document 3).

PRIOR ART DOCUMENTS

Patent Documents

[Patent Document 1]
PCT International Patent Publication No. WO 2015/075794
[Patent Document 2]
Published Japanese Translation No. 2014-527689 of the PCT International Publication
[Patent Document 3]
Published Japanese Translation No. 2019-068552 of the PCT International Publication

SUMMARY OF INVENTION

Problems to be Solved by the Invention

However, in the conventional technology, the use of a charging device for coping with the demand response has not been sufficiently studied. For example, because an amount of electric power capable of being supplied by the charging device varies with the number of batteries and a charging capacity, it is difficult to predict how many users will use the charging device at which timing and it is difficult to accurately predict whether a sufficient amount of electric power can be supplied for a time period of power supply/demand tightness (a time period in which the demand response is requested).

According to an aspect of the present invention, an objective of the present invention is to provide a power prediction system, a power prediction device, a power prediction method, a program, and a storage medium capable of accurately predicting a future amount of electric power capable of being supplied by a charging device to the outside.

Solution to Problem

A power prediction system, a power prediction device, a power prediction method, a program, and a storage medium according to the present invention adopt the following configurations.

(1) According to an aspect of the present invention, there is provided a power prediction system including: a battery removably mounted on an electric power device using electric power; a charging device configured to charge the battery; and a power prediction device configured to predict an amount of electric power capable of being supplied by the charging device to outside of the charging device through machine learning on the basis of usage information indicating at least one of a usage state and a usage environment of the charging device.

(2) In the above-described aspect (1), the power prediction device includes an acquirer configured to acquire the usage information of the charging device at present or at a first point in time in the future; and a predictor configured to predict the amount of electric power capable of being supplied by the charging device to the outside of the charging device at the first point in time by inputting the usage information acquired by the acquirer to a model, the model having been learned to output the amount of electric power at a second point in time in the past when the usage information of the charging device is input at the second point in time.

(3) In the above-described aspect (2), the power prediction device further includes a learning processor configured to derive the amount of electric power capable of being supplied by the charging device to the outside of the charging device at the second point in time on the basis of the number of batteries mounted on the charging device at the second point in time and a charging capacity of the battery mounted on the charging device at the second point in time, and is configured to learn the model on the basis of teacher data in which the derived amount of electric power is associated with the usage information of the charging device at the second point in time.

(4) In the above-described aspect (3), the acquirer acquires the usage information of the charging device for a region where each of a plurality of charging devices is installed and the learning processor is configured to learn the model for each region on the basis of the usage information acquired from the charging device for each region by the acquirer.

(5) In any one of the above-described aspects (2) to (4), the predictor predicts the amount of electric power on the basis of the model when the charging device has received a limited power consumption request.

(6) In the above-described aspect (5), the power prediction device further includes a supply power controller configured to cause electric power to be supplied from the charging device to the outside of the charging device if the amount of electric power predicted by the predictor is greater than or equal to an amount of electric power of a limited power consumption request when the charging device has received the limited power consumption request.

(7) In any one of the above-described aspects (1) to (6), the usage state includes at least one of an index value indicating a charging capacity of the battery mounted on the charging device, the number of batteries mounted on the charging device, and a time.

(8) In any one of the above-described aspects (1) to (7), the usage environment comprises at least one of weather of a region where the charging device is installed, the temperature of the region where the charging device is installed, the date, and the day of the week.

(9) According to another aspect of the present invention, there is provided a power prediction device including: a receiver configured to receive usage information indicating at least one of a usage state and a usage environment of a charging device transmitted from the charging device configured to charge a battery removably mounted on an electric power device using electric power; and a predictor configured to predict the amount of electric power capable of being supplied by the charging device to outside of the charging device through machine learning on the basis of the usage information of the charging device received by the receiver.

(10) According to further another aspect of the present invention, there is provided a power prediction method including steps of: receiving, by a computer, usage information indicating at least one of a usage state and a usage environment of a charging device transmitted from the charging device configured to charge a battery removably mounted on an electric power device using electric power; and predicting, by the computer, an amount of electric power capable of being supplied by the charging device to outside of the charging device through machine learning on the basis of the received usage information.

(11) According to still another aspect of the present invention, there is provided a computer-readable storage medium storing a program according to the above-described aspect (10).

Advantageous Effects of Invention

According to the aspects (1), (2), and (7) to (11), it is possible to accurately predict the future amount of electric power capable of being supplied by the charging device to the outside.

According to the aspect (3), because the data in which the teacher label is associated with the information indicating the usage state and the usage environment of the charging device is used as the teacher data, it is possible to cause a model to learn a behavior pattern of a user depending on the usage state and the usage environment of the charging device.

According to the aspect (4), because the model is learned for each region where the charging device is installed, it is possible to generate a model corresponding to the behavior pattern of the user of each region.

According to the aspect (5), it is possible to determine whether or not the charging device can cope with the demand response with the electric power that can be supplied to the outside for the time period of power supply/demand tightness.

According to the aspect (6), when the amount of electric power capable of being supplied by the charging device to the outside is greater than or equal to the amount of electric power of a limited power consumption request for the customer for the time period of power supply/demand tightness, the electric power is supplied from the charging device to an electric power facility of the customer, so that the customer can use electric power as in other time periods while coping with the demand response from the electric power company.

BRIEF DESCRIPTION OF THE DRAWINGS

FIG. 9 is a flowchart showing an example of a power prediction process using the learning model in the management server.

DESCRIPTION OF EMBODIMENTS

Hereinafter, embodiments of a power prediction system, a power prediction device, a power prediction method, a program, and a storage medium of the present invention will be described with reference to the drawings.

[Overall Configuration of Power Prediction System]

Figure 1:
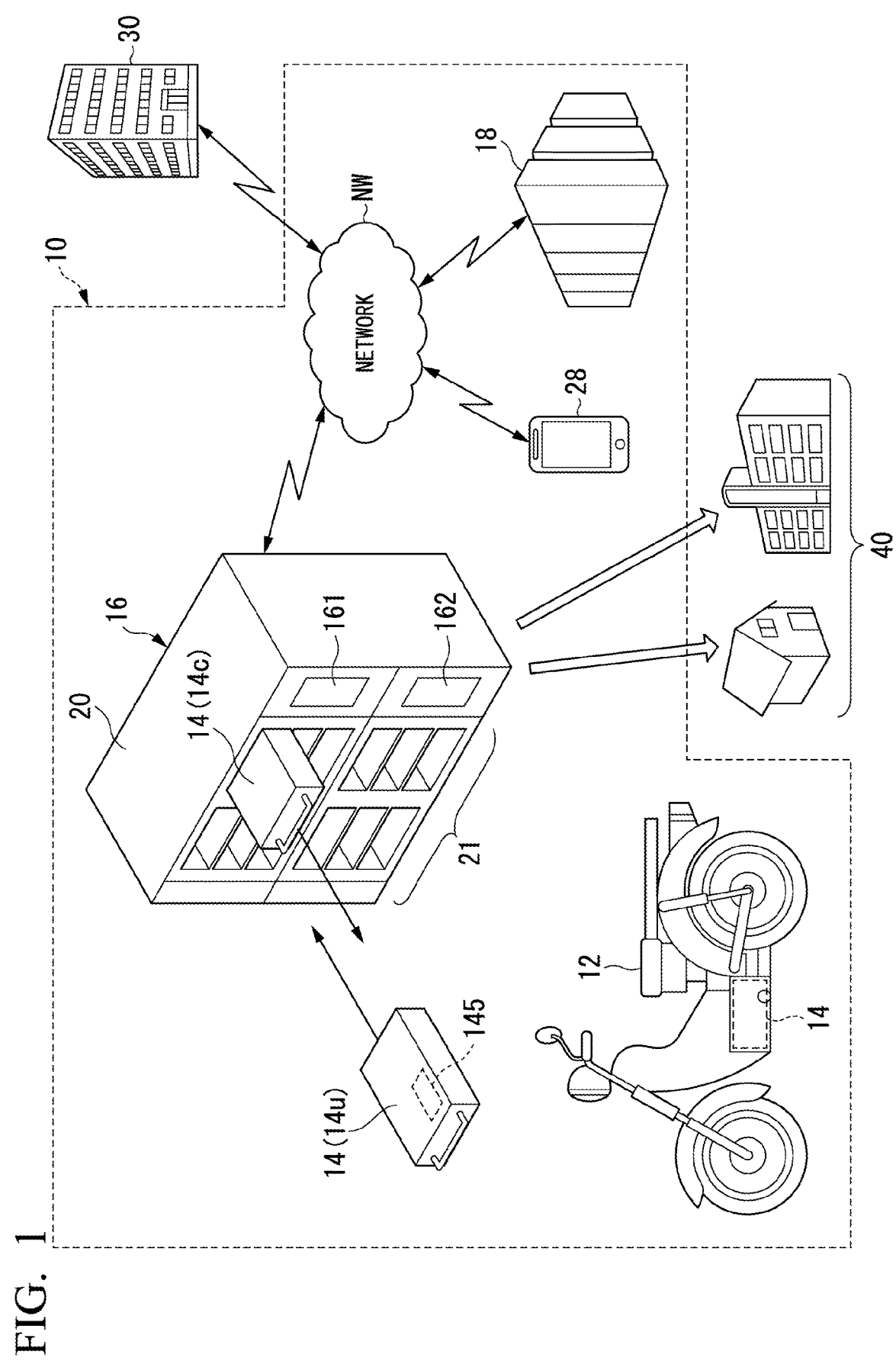
FIG. 1 is a diagram showing an example of a configuration of a power prediction system according to an embodiment.

FIG. 1 is a diagram showing an example of a configuration of a power prediction system 10 according to an embodiment.

As shown in the example, the electric power prediction system 1 is a system in which a removable battery 14 predicts an amount of electric power capable of being supplied by a charging station 16 in a system capable of providing a sharing service in which the removable battery 14, which is a drive source of a saddle-riding type motorcycle 12, is shared by a plurality of users. For example, the power prediction system 1 includes one or more saddle-riding type motorcycles 12, a removable battery 14 capable of supplying electric power to each motorcycle 12, one or more charging stations 16, a management server 18, and a terminal device 28. The motorcycle 12 is an example of an "electric power device," the charging station 16 is an example of a "charging device," and the management server 18 is an example of a "power prediction device."

The "electric power device" is not limited to the motorcycle 12 and may be, for example, a vehicle (a one-wheel vehicle, a three-wheel vehicle, a four-wheel vehicle, or the like) which can travel with electric power and on which a removable battery 14 can be removably mounted, or an assist-type bicycle. Instead of these vehicle-type movable objects, the "electric power device" may be a portable power charging/supplying device carried by a person or a vehicle described in Japanese Unexamined Patent Application, First Publication No. 2019-068552. Also, the "electric power device" may be a movable robot, an autonomous traveling device, an electric bicycle, an autonomous traveling vehicle, another electric vehicle, a drone flying object, or another electric movable device (electric mobility). Hereinafter, an example in which the "electric power device" is the motorcycle 12 will be described.

The motorcycle 12 is an electric vehicle that travels using the electric power supplied by the removable battery 14. The motorcycle 12 may be a vehicle that travels using an internal combustion engine such as a diesel engine or a gasoline engine as a drive source or may be a vehicle that travels using a combination of the removable battery 14 and an internal combustion engine as a drive source.

The removable battery 14 is, for example, a cassette-type power storage device (a secondary battery) that is removably mounted on the motorcycle 12. The removable battery 14 includes a battery-side storage 145 to be described below.

The charging station 16 is a facility for storing and charging one or more removable batteries 14 and is installed in a plurality of places (regions). A plurality of (12 in the example of FIG. 1) slots 21, a display 161, and a reader 162 are provided in a housing 20 of the charging station 16. A charger 163 to be described below is provided on the back side of the slot 21.

The charging station 16 is connected to the management server 18 via the network NW so that communication is enabled. The network NW includes, for example, a local area network (LAN), a wide area network (WAN), and the like.

The management server 18 is connected to the charging station 16, the terminal device 28, and various types of devices of an electric power company 30 via the network NW so that communication is enabled. For example, the management server 18 predicts an amount of electric power capable of being supplied by the charging station 16 to the outside (hereinafter referred to as the amount of electric power capable of being supplied) on the basis of information acquired from a device connected via the network NW. The "outside" is, for example, an electric power facility of a customer 40, an electric(al) power system (EPS), or the like. For example, when a demand response request is received from the electric power company 30, the management server 18 controls the charging station 16 based on the predicted amount of electric power capable of being supplied by the charging station 16 so that the charging station 16 supplies electric power to the electric power facility of the customer 40 or the like.

The demand response request is information for requesting the customer 40 to limit power consumption. For example, the demand response request includes a time period in which limited power consumption is requested (for example, two hours from 12:00 to 14:00 or the like) and an amount of electric power indicating the degree at which power consumption is to be limited (hereinafter referred to as the amount of electric power of a power saving request).

The terminal device 28 is, for example, a portable phone, a smartphone, or a tablet terminal, and is used by a user who owns the motorcycle 12 or the like. The terminal device 28 is connected to the management server 18 via the network NW so that communication is enabled. For example, the user accesses a website or the like provided by the management server 18 via the terminal device 28 and performs a registration procedure for using the sharing service of the removable battery 14 or the like.

[Configuration of Removable Battery]

Figure 2:
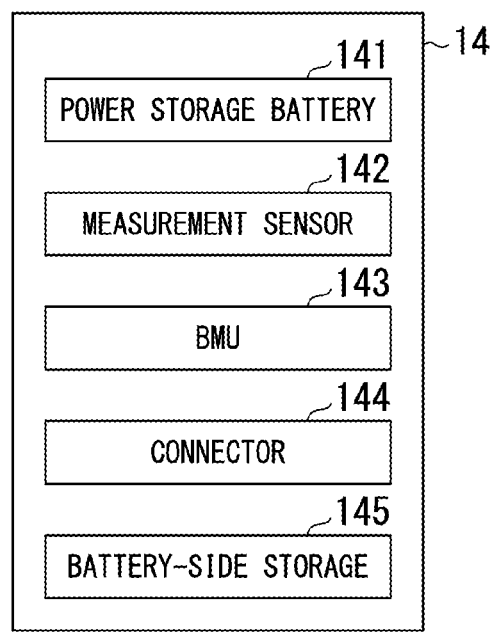
FIG. 2 is a diagram showing an example of a configuration of a removable battery according to the embodiment.

FIG. 2 is a diagram showing an example of a configuration of the removable battery 14 according to the embodiment. As in the example shown in FIG. 2, the removable battery 14 includes a power storage battery 141, a measurement sensor 142, a battery management unit (BMU) 143, a connector 144, and a battery-side storage 145.

The power storage battery 141 includes, for example, a secondary battery such as a lithium ion battery or a lead storage battery. The configuration of the power storage battery 141 may be a battery other than the above and may be another type of secondary battery, a capacitor, or a composite battery which is a combination thereof.

The measurement sensor 142 includes a sensor that detects a voltage of the power storage battery 141, a sensor that detects an electric current of the power storage battery 141, a sensor that detects a temperature of the power storage battery 141, and the like. The measurement sensor 142 outputs a signal indicating the voltage, the electric current, or the temperature of the power storage battery 141 detected under a state in which the removable battery 14 is mounted on the motorcycle 12 to the BMU 143.

For example, the BMU 143 includes a processor such as a central processing unit (CPU), a read only memory (ROM), and the like. For example, a program that is read and executed by the processor is stored in the ROM.

The BMU 143 controls the charging/discharging of the power storage battery 141 based on a command of the control device mounted on the motorcycle 12. The BMU 143 derives a state of charge (SOC) indicating a charging capacity of the power storage battery 141 based on a detection result of the measurement sensor 142. When the BMU 143 derives the SOC, the BMU 143 causes the battery-side storage 145 to store a result of deriving the SOC. At this time, the BMU 143 may cause the battery-side storage 145 to store identification information of the removable battery 14 (hereinafter referred to as a battery ID), the detection result detected by the measurement sensor 32, and the like. For example, the BMU 143 may cause the battery-side storage 145 to store user identification information (hereinafter referred to as a user ID) when authentication in the charging station 16 to be described below has succeeded.

More specifically, the BMU 143 causes the battery-side storage 145 to store information such as an internal temperature of the power storage battery 141 at the time of charging, an internal temperature of the power storage battery 141 at the time of discharging, and a voltage of the power storage battery 141 at the time of discharging as the detection result of the measurement sensor 142 and causes the battery-side storage 145 to store information such as an SOC of the power storage battery 141 that has fluctuated for a period of use from the time when the removable battery 14 is rented to the time when the removable battery 14 is returned as a result of deriving the SOC. A period "from the time when the removable battery 14 is rented to the time when the removable battery 14 is returned" may be a period from the time when the removable battery 14 is extracted from the charging station 16 to the time when the removable battery 14 is remounted on the charging station 16. When the removable battery 14 has been mounted on the motorcycle 12, the BMU 143 may cause the battery-side storage 145 to store detection results of various types of sensors including an odometer mounted on the motorcycle 12 if communication with these sensors is performed. For example, the BMU 143 may cause the battery-side storage 145 to store a traveling distance of the motorcycle 12 measured by the odometer for a period of use from the time when the removable battery 14 is rented to the time when the removable battery 14 is returned. The BMU 143 may cause the battery-side storage 145 to store a capacity retention rate of the power storage battery 141, an internal resistance increase rate, an SOC when left unattended, a battery temperature when left unattended, an elapsed time period from the time of manufacture, the total number of times of charging, and the like.

The connector 144 is an electrical port for charging the power storage battery 141 or discharging the power storage battery 141.

The battery-side storage 145 is implemented by, for example, a random access memory (RAM), an electrically erasable programmable read only memory (EEPROM), an HDD, a flash memory, or the like. As described above, the battery-side storage 145 stores the SOC of the power storage battery 141, the battery ID, the user ID, the detection result of the measurement sensor 32, and the like.

[Configuration of Charging Station]

Figure 3:
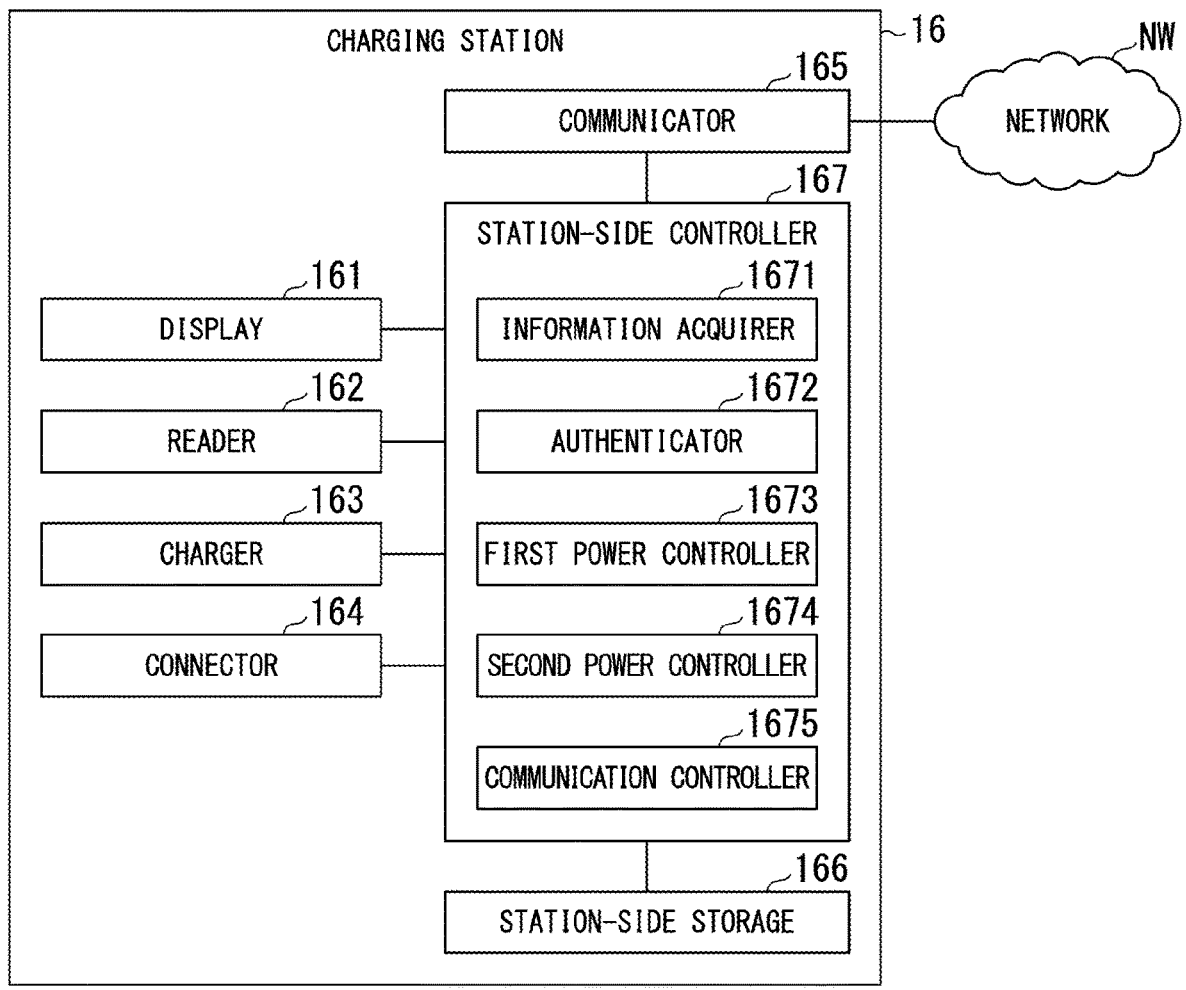
FIG. 3 is a diagram showing an example of a configuration of a charging station according to the embodiment.

FIG. 3 is a diagram showing an example of a configuration of the charging station 16 according to the embodiment. As in the example shown in FIG. 3, the charging station 16 includes a display 161, a reader 162, a charger 163, a connector 164, a communicator 165, a station-side storage 166, and a station-side controller 167. The communicator 165 is an example of an "acquirer" or a "receiver."

The display 161 includes, for example, a liquid crystal display (LCD), an organic electroluminescence (EL) display, a touch panel, and the like, and displays various types of information. For example, the display 161 displays an image generated by the station-side controller 167 and displays a graphical user interface (GUI) for receiving various types of input operations from an operator and the like.

The reader 162 is equipment (a reader) that reads a user ID from an IC card (not shown) carried by the user using, for example, near field communication (NFC). For example, when the IC card is a credit card, the reader 162 reads personal information such as a credit number as a user ID. The reader 162 outputs the read user ID to the station-side controller 167.

For example, one charger 163 is provided in each slot 21. In the charger 163, when the connector 144 on the removable battery 14 side and the connector 164 on the charging station side are electrically or mechanically connected to each other, i.e., when the removable battery 14 is mounted (loaded) in the slot 21, electric power is supplied to the removable battery 14 and the removable battery 14 is charged. A power supply (not shown) for supplying the electric power to the removable battery 14 may be connected to the charger 163.

The connector 164 is a port that is electrically or mechanically connected to the connector 144 on the removable battery 14 side.

The communicator 165 includes, for example, a communication interface such as a network interface card (NIC). For example, the communicator 165 communicates with the management server 18 via the network NW and receives information from the management server 18. The communicator 165 outputs the received information to the station-side controller 167. The communicator 165 may transmit information to another device connected via the network NW under the control of the station-side controller 167.

The station-side storage 166 is implemented by, for example, a ROM, a RAM, an EEPROM, an HDD, a flash memory, or the like. In addition to storing the program, the station-side storage 166 stores a user ID of a user (hereinafter referred to as an authenticated user) who is authorized to use the sharing service of the removable battery 14 and the like. For example, when a user uses the terminal device 28 to access a website that accepts a registration procedure for using the sharing service and registers a name, a credit number, a driver's license number, and the like as personal information on the website, a combination of some or all of the above information elements is stored as a user ID in the station-side storage 166. At this time, the user ID may be stored in the station-side storage 166 via the management server 18.

The station-side controller 167 includes, for example, an information acquirer 1671, an authenticator 1672, a first power controller 1673, a second power controller 1674, and a communication controller 1675. These components are implemented by executing a program (software) by a processor such as a CPU or a graphics processing unit (GPU). Some or all of these components are implemented by hardware (including a circuit; circuitry) such as a large scale integration (LSI) circuit, an application specific integrated circuit (ASIC), or a field-programmable gate array (FPGA) or may be implemented by software and hardware in cooperation. The program may be prestored in the station-side storage 166 or may be stored in a removable storage medium such as a DVD or a CD-ROM and installed in the station-side storage 166 when the storage medium is mounted in a drive device of the charging station 16.

The information acquirer 1671 acquires the user ID from the reader 162 and acquires the received information from the communicator 165. The information acquirer 1671 may acquire information such as the SOC of the removable battery 14 from the battery-side storage 145 of the removable battery 14 loaded in the slot 21.

The authenticator 1672 compares the user ID acquired by the information acquirer 1671 with the user ID of the authenticated user stored in the station-side storage 166 and determines an owner of the IC card whose user ID has been read by the reader 162 is an authenticated user when the user IDs are the same as each other. When it is determined that the owner of the IC card is an authenticated user, the authenticator 1672 causes the reader 162 to display information indicating that the authentication has succeeded. In response to this, the user who has the IC card read by the reader 162 extracts the charged removable battery 14 from the slot 21 and uses the removable battery 14 through the sharing service by replacing the used removable battery 14 mounted on the motorcycle 12 with the charged removable battery 14. When the used removable battery 14 has been loaded in the slot 21, charging is started.

The first power controller 1673 determines whether or not the removable battery 14 has been loaded in the slot 21 and controls the charger 163 when it is determined that the removable battery 14 has been loaded in the slot 21 so that the charger 163 supplies electric power to the removable battery 14 loaded in the slot 21 and charges the removable battery 14. For example, the first power controller 1673 may determine that the removable battery 14 has been loaded in the slot 21 when the connector 144 on the removable battery 14 side and the connector 164 on the charging station side have been electrically or mechanically connected to each other and determine that the removable battery 14 has not been loaded in the slot 21 otherwise.

When the communicator 165 has received a specific command (a second command to be described below) from the management server 18, the second power controller 1674 discharges the removable battery 14 loaded in each slot 21 with electric power and the electric power of the discharging is supplied to the electric power facility of the customer 40 via the electric power system.

The communication controller 1675 controls the communicator 165 so that the communicator 165 transmits information indicating a usage state of the charging station 16

(hereinafter referred to as station usage state information) to the management server 18 at predetermined intervals (for example, in units of hours, days, weeks, or months). For example, the communication controller 1675 transmits information including the SOC of the removable battery 14 loaded in each slot 21, the number of removable batteries 14 loaded in the slot 21, and a transmission time as the station usage state information to the management server 18.

[Configuration of Management Server]

Figure 4:
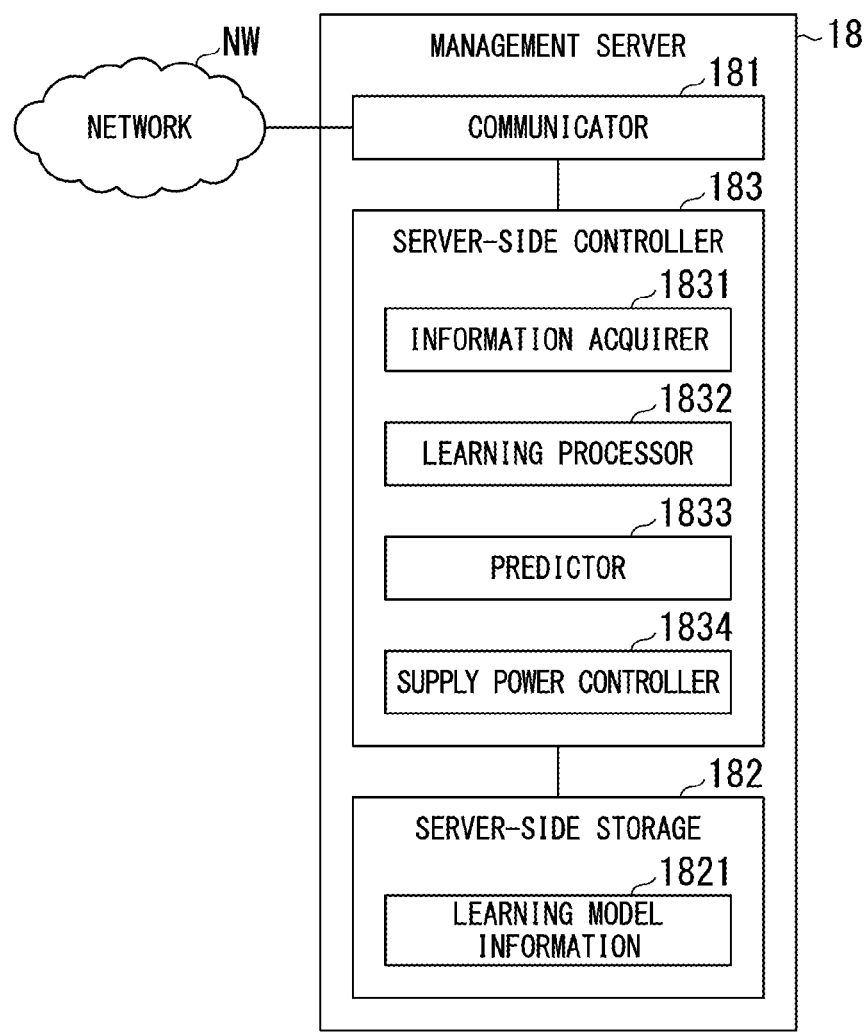
FIG. 4 is a diagram showing an example of a configuration of a management server according to the embodiment.

FIG. 4 is a diagram showing an example of a configuration of the management server 18 according to the embodiment. As in the example shown in FIG. 4, the management server 18 includes a communicator 181, a server-side storage 182, and a server-side controller 183.

The communicator 181 includes, for example, a communication interface such as a Network Interface Card (NIC). For example, the communicator 181 communicates with each charging station 16 via the network NW and receives information from each charging station 16. The communicator 181 may communicate with a device of the electric power company 30 via the network NW and receive a demand response request. The communicator 181 outputs received information to the server-side controller 183. The communicator 181 is controlled by the server-side controller 183 and transmits information to the charging station 16 connected via the network NW.

The server-side storage 182 is implemented by, for example, a ROM, a RAM, an EEPROM, an HDD, a flash memory, or the like. In addition to storing the program, the server-side storage 182 stores learning model information 1821. This will be described below.

The server-side controller 183 includes, for example, an information acquirer 1831, a learning processor 1832, a predictor 1833, and a supply power controller 1834. These components are implemented by a processor such as a CPU or a GPU executing a program (software). Some or all of these components may be implemented by hardware (including a circuit; circuitry) such as an LSI circuit, an ASIC, or an FPGA or may be implemented by software and hardware in cooperation. The program may be prestored in the server-side storage 182 or may be stored in a removable storage medium such as a DVD or a CD-ROM and installed in the server-side storage 182 when the storage medium is mounted in the drive device of the management server 18.

For example, the information acquirer 1831 acquires station usage state information from the charging station 16 via the communicator 181.

The learning processor 1832 learns a learning model (Model Domain Learning (MDL)) indicated by the learning model information 1821 stored in the server-side storage 182 based on the information acquired by the information acquirer 1831. Thereby, the learning model information 1821 is updated.

The learning model information 1821 is a program or a data structure indicating a certain learning model MDL. The learning model MDL is learned so that an amount of electric power capable of being supplied by the charging station 16 to the outside (i.e., an amount of electric power capable of being supplied) is output at the same time when information indicating at least one or both of a usage state and a usage environment of the charging station 16 at a certain point in time is input. For example, the learning model MDL may be learned according to any one of deep learning, random forest regression, extreme gradient (XG)-boosting, a support vector machine, or an ensemble learning method which is a combination thereof. The ensemble learning method includes, for example, bagging, boosting, and the like.

The predictor 1833 predicts an amount of electric power capable of being supplied by the charging station 16 at a certain point in time in the future based on the learning model MDL indicated by the learning model information 1821. For example, when the communicator 181 receives a demand response request from the electric power company 30, the predictor 1833 predicts the amount of electric power capable of being supplied by the charging station 16 for a time period (a future time period) of limited power consumption included in the demand response request. The limited power consumption time period included in the demand response request is not limited to a future time period, and may be a current time period.

The supply power controller 1834 compares the amount of electric power capable of being supplied by the charging station 16 for the limited power consumption time period predicted by the predictor 1833 with an amount of electric power of a power saving request included in the demand response request and controls the charging station 16 so that electric power is supplied from the charging station 16 to the electric power facility of the customer 40 when the amount of electric power capable of being supplied is greater than or equal to the amount of electric power of the power saving request. The electric power facility of the customer 40 is an example of the "outside of the charging device."

[Flow of Learning Process (Training) of Learning Model]

Figure 5:
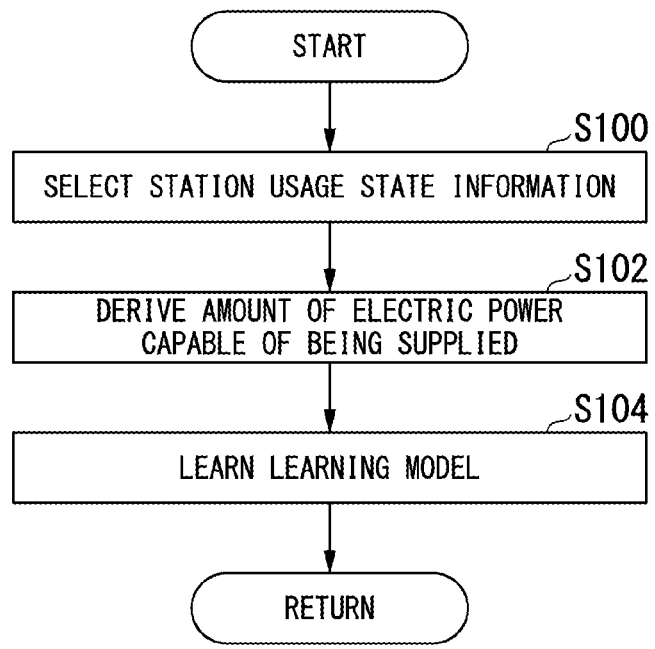
FIG. 5 is a flowchart showing an example of a learning process of a learning model in the management server.

A learning process (training) of the learning model MDL will be described below. FIG. 5 is a flowchart showing an example of the learning process of the learning model MDL in the management server 18. The process of the present flowchart may be performed, for example, when the number of times the station usage state information has been received by the communicator 181 has reached a predetermined number of times.

First, the learning processor 1832 selects station usage state information of certain transmission time $T_i$ serving as a processing target from a plurality of station usage state information elements received by the communicator 181 (step S100). The plurality of station usage information elements have mutually different transmission times.

Next, the learning processor 1832 derives an amount of electric power $P_i$ capable of being supplied by the charging station 16 at transmission time $T_i$ of the selected station usage state information (step S102).

For example, the learning processor 1832 derives an amount of electric power $P_i$ capable of being supplied by the charging station 16 in which removable batteries 14 are loaded in the slots 21 at transmission time $T_i$ of the station usage state information based on the number of removable batteries 14 and the SOC of each removable battery 14 included in the station usage state information.

Next, the learning processor 1832 learns the learning model MDL (step S104). For example, the learning processor 1832 generates teacher data in which the amount of electric power $P_i$ capable of being supplied by the charging station 16 derived based on the number of removable batteries 14 and the SOC of each removable battery 14 is associated as a teacher label with certain learning data. For example, the learning data includes information indicating a type of usage environment in which the charging station 16 is placed and a type of usage state in which the charging station 16 is placed at time $T_i$ (station usage state information at time $T_i$). The teacher data indicates that, if the charging station 16 is in such a usage environment and such a usage state, the amount of electric power capable of being supplied by the charging station 16 output by the learning model MDL should be a correct amount of electric power.

For example, the learning processor 1832 identifies weather and a temperature of a region where the charging station 16 is installed, a date, a day of the week, and the like as the usage environment of the charging station 16 at time $T_i$ with reference to calendar information, weather forecast information, and the like. The calendar information, the weather forecast information, and the like may be prestored in the server-side storage 182 or may be downloaded from an external device at predetermined intervals.

The learning processor 1832 generates data including time (time period) $T_i$ and the like as learning data at time $T_i$ in addition to the weather, the temperature, the date, and the day of the week in the region where the charging station 16 is installed at time $T_i$ identified as the usage environment of the charging station 16. The learning processor 1832 generates teacher data by associating the generated learning data of time $T_i$ with an amount of electric power $P_i$ capable of being supplied by the charging station 16 at time $T_i$ derived based on the number of removable batteries 14 and the SOC of each removable battery 14 as a teacher label. That is, the learning processor 1832 generates data in which electric power capable of being supplied by the charging station 16 (theoretically calculated electric power capable of being supplied) at current time $T_i$ is associated with information indicating the usage environment and the usage state of the charging station 16 at current time $T_i$ as teacher data. The learning processor 1832 may generate data in which electric power capable of being supplied by the charging station 16 (theoretically calculated electric power capable of being supplied) at current time $T_i$ is associated with information indicating at least one of the usage environment and the usage state of the charging station 16 at current time $T_i$ as teacher data.

When the learning processor 1832 generates the teacher data, the learning model MDL is learned using the teacher data. For example, the learning processor 1832 inputs the learning data at time $T_i$ to the learning model MDL and causes the learning model MDL to derive an amount of electric power $P_i\#$ capable of being supplied by the charging station 16 at time $T_i$. The learning processor 1832 derives a difference (an absolute value $(P_i - P_i\#)$) between the amount of electric power $P_i\#$ capable of being supplied by the charging station 16 at time $T_i$ derived by the learning model MDL based on the learning data of time $T_i$ and the amount of electric power $P_i$ capable of being supplied by the charging station 16 at time $T_i$ associated as the teacher label with the learning data of time $T_i$. The learning processor 1832 learns the learning model MDL while changing the parameters of the learning model MDL so that the derived difference becomes small. For example, when the learning model MDL is a neural network, the learning processor 1832 may determine parameters such as a weighting coefficient and a coupling coefficient of an activation function of the neural network so that the difference between the amount of electric power $P_i\#$ capable of being supplied and the amount of electric power $P_i$ capable of being supplied becomes small using a stochastic gradient descent method or the like. Thereby, the process of the present flowchart ends. When the learning model MDL is learned by such a series of processes, the learning model information 1821 stored in the server-side storage 182 is updated.

When the power prediction system 1 includes a plurality of charging stations 16, the learning processor 1832 may generate the learning model MDL corresponding to an installation region by performing the above-described process of the flowchart for a region where each of the plurality of charging stations 16 is installed.

Figure 6:
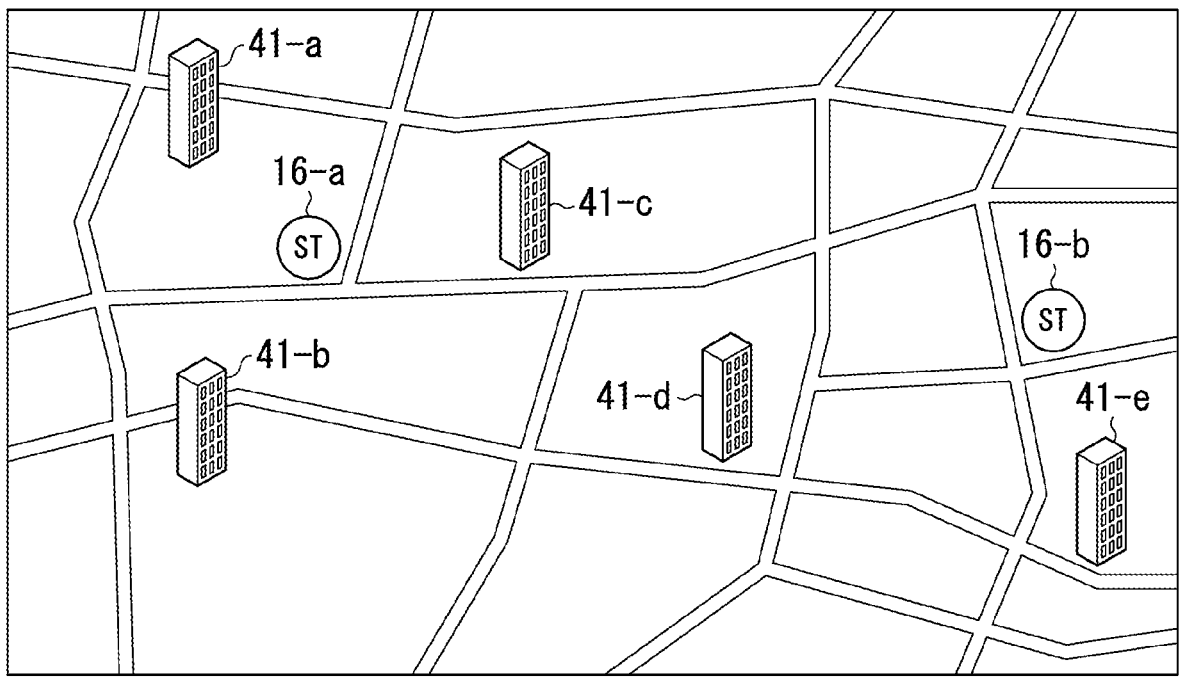
FIG. 6 is a diagram showing an example of a map including a region where the charging station is installed.
Figures 7, 8:
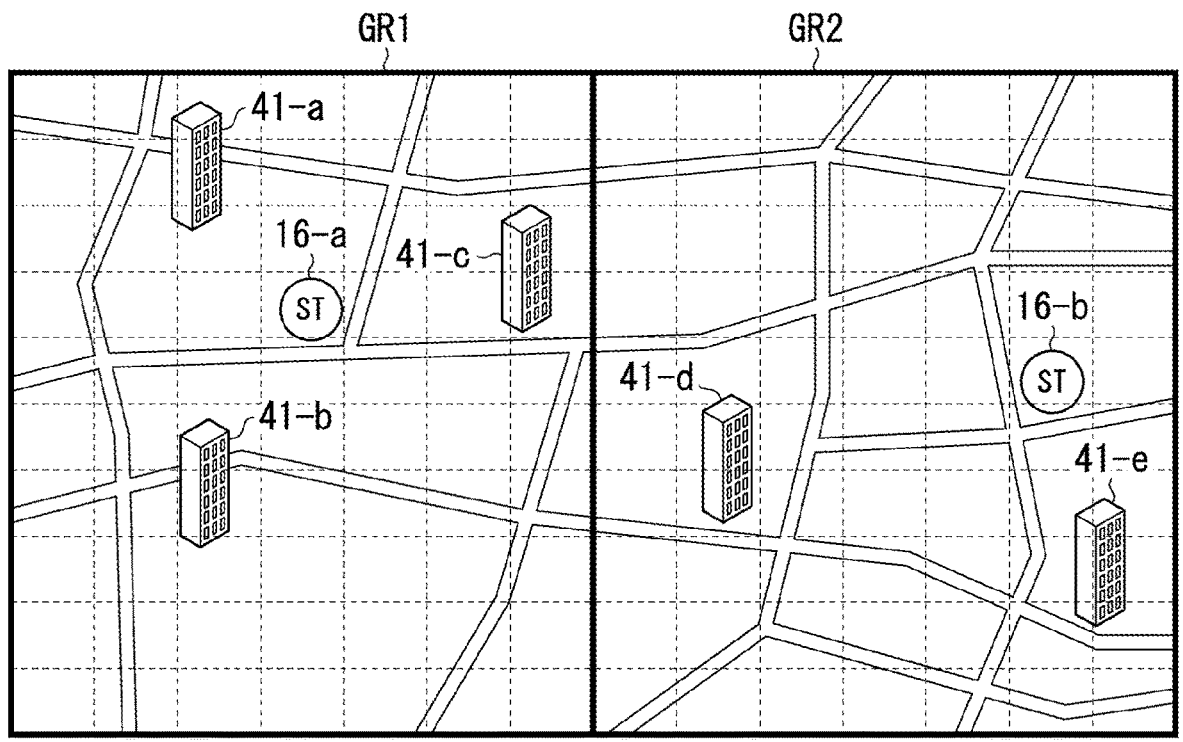
FIG. 7 is a diagram showing an example of a map including a region where the charging station is installed.
FIG. 8 is a diagram showing an example of learning model information when the learning model is learned for each grid.

FIGS. 6 and 7 are diagrams showing examples of a map including a region where the charging station 16 is installed. In the examples shown in FIGS. 6 and 7, a charging station 16-a and a charging station 16-b are installed in a certain region and electric power facilities of customers 40-a to 42-e are installed near the charging station 16-a and the charging station 16-b. As in an example shown in FIG. 7, the learning processor 1832 divides the installation region of the charging station 16 into grids GR, each of which has a predetermined size. In the example of FIG. 7, the installation region of the charging station 16 is divided into two grids GR1 and GR2.

In this case, for example, the learning processor 1832 derives the amount of electric power $P_i$ capable of being supplied by the charging station 16-a at transmission time $T_i$ of the station usage state information based on the station usage state information received from the charging station 16-a included in the grid GR1. The learning processor 1832 generates learning data including weather, a temperature, a date, a day of the week, a time, and the like in the installation region of the charging station 16-a at time $T_i$ and generates teacher data in which the amount of electric power $P_i$ capable of being supplied by the charging station 16-a at transmission time $T_i$ is associated as the teacher label with the learning data. The learning processor 1832 learns the first learning model $MDL_1$ based on the generated teacher data.

The learning processor 1832 derives the amount of electric power $P_i$ capable of being supplied by the charging station 16-b at transmission time $T_i$ of the station usage state information based on the station usage state information received from the charging station 16-b included in the grid GR2. The learning processor 1832 generates learning data including weather, a temperature, a date, a day of the week, a time, and the like in the installation region of the charging station 16-b at time $T_i$ and generates teacher data in which the amount of electric power $P_i$ capable of being supplied by the charging station 16-b at transmission time $T_i$ is associated as the teacher label with the learning data. The learning processor 1832 learns a second learning model $MDL_2$ different from the first learning model $MDL_1$ learned for the grid GR1 based on the generated teacher data. In this manner, the learning processor 1832 can generate learning models MDL having different characteristics in accordance with the region by learning the learning model MDL for each grid GR.

FIG. 8 is a diagram showing an example of the learning model information 1821 when the learning model MDL has been learned for each grid GR. As in the example shown in FIG. 8, the learning model information 1821 may be information in which a grid ID for identifying the grid GR, a learning model ID for identifying the learning model MDL, and an update date of the learning model MDL, and the like are associated with each region divided in units of municipalities. The region is not limited to the municipality and may be a prefecture unit, a predetermined region on a power transmission network (an electric power system) of the electric power company 30, or any other region.

[Flow of Power Prediction Process (Runtime) Using Learning Model]

The power prediction process (runtime) using the learning model MDL will be described below. FIG. 9 is a flowchart showing an example of the power prediction process using the learning model MDL in the management server 18. The process of the present flowchart may be iterated, for example, at predetermined intervals.

First, the predictor 1833 determines whether or not a demand response request has been received by the communicator 181 (step S200). When it is determined that the demand response request has been received by the communicator 181, the predictor 1833 selects a learning model MDL corresponding to a region of a limited power consumption request as the demand response request (hereinafter referred to as a power saving request region) from a plurality of learning models MDL included in the learning model information 1821 (step S202).

For example, when the power saving request region is a region such as an "ABC city," the predictor 1833 selects a learning model MDL whose learning model ID is "$MDL_1$" associated with the region such as the "ABC city" with reference to the learning model information 1821 shown in the example of FIG. 8.

Next, the predictor 1833 predicts an amount of electric power capable of being supplied by the charging station 16 installed in the power saving request region for a future limited power consumption time period included in the demand response request based on the selected learning model MDL (step S202).

For example, the predictor 1833 acquires weather and a temperature of the power saving request region of a future time period designated as the limited power consumption time period from weather forecast information and the like and also acquires a date and a day of the week of the reception of the demand response request from calendar information. The predictor 1833 inputs data including the weather and temperature of the power saving request region of the limited power consumption time period and the date, the day of the week, and the time of the reception of the demand response request that have been acquired to the selected learning model MDL, thereby deriving an amount of electric power capable of being supplied by the charging station 16 of the power saving request region for the future limited power consumption time period.

Next, the supply power controller 1834 determines whether or not the amount of electric power capable of being supplied by the charging station 16 for the limited power consumption time period predicted by the predictor 1833 is greater than or equal to an amount of electric power of the power saving request included in the demand response request (step S206).

When the supply power controller 1834 determines that the amount of electric power capable of being supplied is less than the amount of electric power of the power saving request, the processing of S208 and S210 to be described below is omitted and the process of the present flowchart ends.

On the other hand, when the supply power controller 1834 determines that the amount of electric power capable of being supplied is greater than or equal to the amount of electric power of the power saving request, the supply power controller 1834 controls the communicator 181 so that the communicator 181 transmits a first command to the electric power facility of the customer 40 present in the power saving request region (step S208). The first command is a command for causing the electric power facility of the customer 40 to reduce power consumption by an amount of electric power of the power saving request. For example, in the example of FIG. 7, when the power saving request region is the region included in the grid GR1, the supply power controller 1834 controls the communicator 181 so that the communicator 181 transmits the first command to the electric power facility of each of the customers 40-*a*, 41-*b*, and 41-*c*. For example, the electric power facility of the customer 40 which has received the first command reduces an amount of electric power to be received from the electric power company 30 and starts receiving the reduced amount of electric power from the charging station 16 instead.

Next, the supply power controller 1834 controls the communicator 181 so that the communicator 181 transmits a second command to the charging station 16 present in the power saving request region (step S210). The second command is a command for causing the charging station 16 to supply the electric power facility of the customer 40 with electric power corresponding to an amount of electric power of the power saving request. For example, in the example of FIG. 7, when the power saving request region is the region included in the grid GR1, the supply power controller 1834 controls the communicator 181 so that the communicator 181 transmits the second command to the charging station 16-*a*.

When the second command is received by the communicator 165, the second power controller 1674 of the charging station 16 causes the removable battery 14 loaded in each slot 21 to be discharged with electric power and the electric power of the discharging is supplied to the electric power facility of the customer 40 via the electric power system. Thereby, electric power corresponding to an amount of electric power of the power saving request is supplied from the charging station 16 to the electric power facility of each customer 40.

According to the above-described embodiment, the power prediction system 1 includes one or more removable batteries 14 removably mounted on the motorcycle 12 movable using electric power; the charging station 16 configured to charge the removable battery 14 loaded in the slot 21; and the management server 18 configured to predict an amount of electric power capable of being supplied by the charging station 16 at a certain point in time in the future through machine learning based on a usage state and a usage environment of the charging station 16, thereby accurately predicting a future amount of electric power capable of being supplied by the charging station 16. Thereby, for example, for a time period of power supply/demand tightness (a time period in which a demand response is requested), it is possible to supply sufficient electric power, which corresponds to an amount of electric power of a limited power consumption request transmitted from the electric power company 30 to the customer 40, from the charging station 16 to the electric power facility of the customer 40. As a result, the customer 40 can use the electric power as in other time periods in which the demand response is not requested while coping with the demand response from the electric power company 30.

According to the above-described embodiment, when a learning model such as a neural network is learned, it is possible to generate a learning model suitable for a behavior pattern of a user who uses the sharing service for the removable batteries 14 because weather, a temperature, and the like of a region where the charging station 16 is installed are used as learning data. In general, as is known, it is difficult for a user to get on the motorcycle 12 in bad weather such as rain or snow. In this case, information indicating that a usage rate (a replacement frequency) of the removable battery 14 of the charging station 16 tends to be small and an amount of electric power capable of being supplied increases as compared with good weather such as fine weather is applied to a parameter of the learning model MDL. In this manner, because it is possible to cause the learning model to learn a behavior pattern of the user depending on the weather, the temperature, the day of the week, the time, and the like, a future amount of electric power capable of being supplied by the charging station 16 can be predicted more accurately.

According to the above-described embodiment, because the learning model MDL is learned for each region where the charging station 16 is installed, it is possible to generate a learning model MDL corresponding to a behavior pattern of the user in each region.

Although modes for carrying out the present invention have been described above using the embodiments, the present invention is not limited to the embodiments and various modifications and replacements can be applied without departing from the spirit and scope of the present invention.

DESCRIPTION OF REFERENCE NUMERALS

10 Power prediction system
12 Motorcycle (electric power device)
14 Removable battery
141 Power storage battery
142 Measurement sensor
143 BMU
144 Connector
145 Battery-side storage
16 Charging station (charging device)
161 Display
162 Reader
163 Charger
164 Connector
165 Communicator
166 Station-side storage
167 Station-side controller
1671 Information acquirer
1672 Authenticator
1673 First power controller
1674 Second power controller
1675 Communication controller
18 Management server (power prediction device)
181 Communicator
182 Server-side storage
183 Server-side controller
1831 Information acquirer
1832 Learning processor
1833 Predictor
1834 Supply power controller
28 Terminal device
30 Electric power company
40 Customer

The invention claimed is:

1. A power prediction system comprising:
a battery removably mounted on an electric power device using electric power;
a charging device configured to charge the battery; and
a power prediction device configured to predict an amount of electric power capable of being supplied by the charging device to outside of the charging device through machine learning based on usage information indicating at least one of a usage state and a usage environment of the charging device,
wherein the power prediction device comprises a processor configured to execute instructions to:
acquire the usage information of the charging device at a first point in time;
input the acquired usage information at the first point in time to a model, the model having been learned to output the amount of electric power when the usage information of the charging device is input; and
predict the amount of electric power capable of being supplied by the charging device to the outside of the charging device at the first point in time based on an output result of the model with the acquired usage information at the first point in time input.

2. The power prediction system according to claim 1, wherein the processor is further configured to execute instructions to:
derive the amount of electric power capable of being supplied by the charging device to the outside of the charging device based on the number of batteries mounted on the charging device and a charging capacity of the battery mounted on the charging device, and
learn the model based on a dataset in which the derived amount of electric power is associated with the usage information of the charging device.

3. The power prediction system according to claim 2, wherein the processor is further configured to execute instructions to:
acquire the usage information of the charging device for a region where each of a plurality of charging devices is installed, and
learn the model for each region based on the usage information acquired from the charging device for each region.

4. The power prediction system according to claim 1, wherein the processor is further configured to execute instructions to: predict the amount of electric power based on the model when the charging device has received a limited power consumption request.

5. The power prediction system according to claim 4, wherein the processor is further configured to execute instructions to: cause electric power to be supplied from the charging device to the outside of the charging device if the predicted amount of electric power is greater than or equal to an amount of electric power of a limited power consumption request when the charging device has received the limited power consumption request.

6. The power prediction system according to claim 1, wherein the usage state comprises at least one of an index value indicating a charging capacity of the battery mounted on the charging device, the number of batteries mounted on the charging device, and a time.

7. The power prediction system according to claim 1, wherein the usage environment comprises at least one of weather of a region where the charging device is installed, a temperature of the region where the charging device is installed, a date, and a day of the week.

8. A power prediction device comprising:
a receiver configured to receive usage information indicating at least one of a usage state and a usage environment of a charging device transmitted from the charging device configured to charge a battery removably mounted on an electric power device using electric power; and
a processor configured to execute instructions to: predict an amount of electric power capable of being supplied by the charging device to outside of the charging device through machine learning based on the usage information of the charging device received by the receiver,
wherein the receiver configured to receive the usage information of the charging device at a first point in time; and
wherein the processor is further configured to further execute instructions to:

input the received usage information at the first point in time to a model, the model having been learned to output the amount of electric power when the usage information of the charging device is input, and predict the amount of electric power capable of being supplied by the charging device to the outside of the charging device at the first point in time based on an output result of the model with the received usage information at the first point in time input.

9. A power prediction method comprising steps of:

receiving, by a computer, usage information indicating at least one of a usage state and a usage environment of a charging device transmitted from the charging device configured to charge a battery removably mounted on an electric power device using electric power;

predicting, by the computer, an amount of electric power capable of being supplied by the charging device to outside of the charging device through machine learning based on the received usage information;

receiving, by the computer, the usage information of the charging device at a first point in time;

inputting, by the computer, the received usage information at the first point in time to a model, the model having been learned to output the amount of electric power when the usage information of the charging device is input; and predicting, by the computer, the amount of electric power capable of being supplied by the charging device to the outside of the charging device at the first point in time based on an output result of the model with the received usage information at the first point in time input.

10. A computer-readable non-transitory storage medium storing a program for causing a computer to execute steps of:

receiving usage information indicating at least one of a usage state and a usage environment of a charging device transmitted from the charging device configured to charge a battery removably mounted on an electric power device using electric power; and predicting an amount of electric power capable of being supplied by the charging device to outside of the charging device through machine learning based on the received usage information;

receiving the usage information of the charging device at a first point in time;

inputting the received usage information at the first point in time to a model, the model having been learned to output the amount of electric power when the usage information of the charging device is input; and predicting the amount of electric power capable of being supplied by the charging device to the outside of the charging device at the first point in time based on an output result of the model with the received usage information at the first point in time input.

* * * * *